(12) United States Patent
Yu

(10) Patent No.: US 6,297,117 B1
(45) Date of Patent: Oct. 2, 2001

(54) FORMATION OF CONFINED HALO REGIONS IN FIELD EFFECT TRANSISTOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,389

(22) Filed: Feb. 12, 2001

(51) Int. Cl.[7] .................................................. H01L 21/336
(52) U.S. Cl. ............................................................. 438/305
(58) Field of Search .................................. 438/305, 303, 438/306, 307, 308

(56) References Cited

U.S. PATENT DOCUMENTS

| | | | |
|---|---|---|---|
| 5,595,919 | * 1/1997 | Pan | 437/29 |
| 5,736,446 | * 4/1998 | Wu | 438/305 |
| 5,899,719 | * 5/1999 | Hong | 438/289 |
| 6,114,211 | * 9/2000 | Fulford et al. | 438/305 |

* cited by examiner

*Primary Examiner*—David Nelms
*Assistant Examiner*—Quoc Hoang
(74) *Attorney, Agent, or Firm*—Monica H. Choi

(57) ABSTRACT

Halo regions are formed for a field effect transistor having a gate structure on a gate dielectric within an active device area of a semiconductor substrate. A first dummy spacer is formed on a first sidewall, and a second dummy spacer is formed on a second sidewall, of the gate structure and the gate dielectric. The first dummy spacer is disposed substantially over a drain extension junction, and the second dummy spacer is disposed substantially over a source extension junction of the field effect transistor. An insulating material is deposited to cover the first dummy spacer, the second dummy spacer, and the gate structure. The insulating material is polished down such that the top surfaces of the gate structure, the first dummy spacer, and the second dummy spacer are exposed and are level with a top surface of the insulating material. The first dummy spacer is etched away to form a first spacer opening, and the second dummy spacer is etched away to form a second spacer opening. A halo dopant is implanted through the first spacer opening to form a drain halo region substantially only beneath the drain extension junction within the semiconductor substrate and through the second spacer opening to form a source halo region substantially only beneath the source extension junction within the semiconductor substrate. The drain halo region and the source halo region are heated up in a thermal anneal process, such as a (LTP) laser thermal process, to activate the halo dopant substantially only within the drain halo region and the source halo region. An amorphization dopant may also be implanted into the drain halo region and the source halo region for activating the halo dopant within the drain and source halo regions at a lower temperature.

12 Claims, 4 Drawing Sheets

FORMATION OF CONFINED HALO REGIONS IN FIELD EFFECT TRANSISTOR

TECHNICAL FIELD

The present invention relates generally to fabrication of field effect transistors having scaled-down dimensions, and more particularly, to fabrication of a field effect transistor with highly confined halo regions formed by etching away dummy spacers to implant halo dopant through dummy spacer openings that are disposed substantially over drain and source extension junctions.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate structure 118 and the gate dielectric 116. When the spacer 122 is comprised of silicon nitride ($Si_3N_4$), a spacer liner oxide 124 is deposited as a buffer layer between the spacer 122 and the sidewalls of the gate structure 118 and the gate dielectric 116 and between the spacer 122 and the semiconductor substrate 102.

As the dimensions of the MOSFET 100 are further scaled down to tens of nanometers, short channel effects are more likely to disadvantageously affect the operation of the MOSFET 100, as known to one of ordinary skill in the art of integrated circuit fabrication. Referring to FIG. 2, to prevent short channel effects as the dimensions of the MOSFET 100 are further scaled down, halo regions 132 and 134 are formed to be beneath the drain extension junction 104 and the source extension junction 106 in the semiconductor substrate 102. A drain halo region 132 is formed to be beneath the drain extension junction 104, and a source halo region 134 is formed to be beneath the source extension junction 106.

The halo regions 132 and 134 are implanted with a halo dopant that is opposite in type to the dopant within the drain and source extension junctions 104 and 106. For example, when the drain and source extension junctions 104 and 106 are implanted with an N-type dopant for an NMOSFET (N-channel Metal Oxide Semiconductor Field Effect Transistor), the halo regions 132 and 134 are implanted with a P-type dopant for preventing short channel effects of the NMOSFET. On the other hand, when the drain and source extension junctions 104 and 106 are implanted with a P-type dopant for a PMOSFET (P-channel Metal Oxide Semiconductor Field Effect Transistor), the halo regions 132 and 134 are implanted with an N-type dopant for preventing short channel effects of the PMOSFET. Such halo regions 132 and 134 are known to one of ordinary skill in the art of integrated circuit fabrication.

Referring to FIG. 2, the halo dopant within the halo regions 132 and 134 diffuse due to transient enhanced diffusion during any integrated circuit fabrication process that heats up the semiconductor substrate 102. In that case, the drain halo region 132 extends into the drain contact junction 108, and the source halo region 134 extends into the source contact junction 112, to undesirably increase the series resistance of the drain and source contact junctions 108 and 112. In addition, the drain and source halo regions 132 and 134 extend toward the channel region 136 of the MOSFET 100 between the drain and source extension junctions 104 and 106, to undesirably increase the short channel effects of the MOSFET 100. Furthermore, the drain and source halo regions 132 and 134 may also extend vertically along the semiconductor substrate 102 from transient enhanced diffusion, undesirably occupying greater volume of the semiconductor substrate 102.

Nevertheless, halo regions are desired for reducing short channel effects of a MOSFET as the dimensions of the MOSFET are further scaled down. Thus, a mechanism is desired for forming halo regions to be confined to be substantially only beneath the drain and source extension junctions with minimization of transient enhanced diffusion of the halo dopant.

SUMMARY OF THE INVENTION

Accordingly, in a general aspect of the present invention, highly confined halo regions of a MOSFET are formed by etching away dummy spacers to implant halo dopant through dummy spacer openings that are disposed substantially over drain and source extension junctions.

In one embodiment of the present invention, halo regions are formed for a field effect transistor having a gate structure on a gate dielectric within an active device area of a semiconductor substrate. A first dummy spacer is formed on a first sidewall of the gate structure and the gate dielectric, and the first dummy spacer is disposed substantially over a drain extension junction of the field effect transistor. Similarly, a second dummy spacer is formed on a second sidewall of the gate structure and the gate dielectric, and the second dummy spacer is disposed substantially over a source extension junction of the field effect transistor. An insulating material is deposited to cover the first dummy spacer, the second dummy spacer, and the gate structure. The insulating material is polished down until top surfaces of the gate structure, the first dummy spacer, and the second dummy spacer are exposed such that the top surfaces of the gate structure, the first dummy spacer, and the second dummy spacer are level with a top surface of the insulating material.

The first dummy spacer is etched away to form a first spacer opening, and the second dummy spacer is etched away to form a second spacer opening. A halo dopant is implanted through the first spacer opening to form a drain halo region substantially beneath the drain extension junction within the semiconductor substrate and through the second spacer opening to form a source halo region substantially beneath the source extension junction within the semiconductor substrate. The drain halo region and the source halo region are heated up in a thermal anneal process to activate the halo dopant within the drain halo region and the source halo region.

In another aspect of the present invention, an amorphization dopant is also implanted through the first spacer opening and the second spacer opening to form an amorphous semiconductor region within the drain halo region and the source halo region before the step of activating the halo dopant within the drain halo region and the source halo region. With formation of the amorphous semiconductor region within the drain halo region and the source halo region, a lower temperature may be used to activate the halo dopant within the drain halo region and the source halo region for minimized transient enhanced diffusion of the halo dopant. Furthermore, with the lower temperature for activating the halo dopant, the halo dopant is activated substantially only within the amorphous drain and source halo regions to further confine the drain and source halo regions.

In a further aspect of the present invention, for activating the halo dopant within the drain and source halo regions, a laser beam is applied toward the semiconductor substrate such that the laser beam applied through the first spacer opening and the second spacer opening heats up substantially only the drain and source halo regions to activate the halo dopant substantially only within the drain halo region and the source halo region to further confine the drain and source halo regions.

In another aspect of the present invention, any thermal anneal processes for activating dopant within the gate structure, the drain and source extension junctions, and the drain and source contact junctions of the field effect transistor are performed before formation of the drain and source halo regions. In addition, a drain silicide is formed within the drain contact junction and a source silicide is formed within the source contact junction with heating of the semiconductor substrate before formation of the drain and source halo regions. With such processes for heating up the semiconductor substrate being performed before formation of the drain and source halo regions, transient enhanced diffusion of the halo dopant within the drain and source halo regions is minimized to further confine the drain and source halo regions.

In this manner, the drain halo region is confined to be substantially beneath the drain extension junction and the source halo region is confined to be substantially beneath the source extension junction. When the drain and source halo regions do not extend into the drain and source contact junctions, series resistance at the drain and source contact junctions is minimized. When the drain and source halo regions do not extend into the channel region of the field effect transistor between the drain and source extension junctions, short channel effects of the field effect transistor are minimized. In addition, the halo regions are confined to be vertically abrupt with minimized transient enhanced diffusion of the halo dopant.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 1:
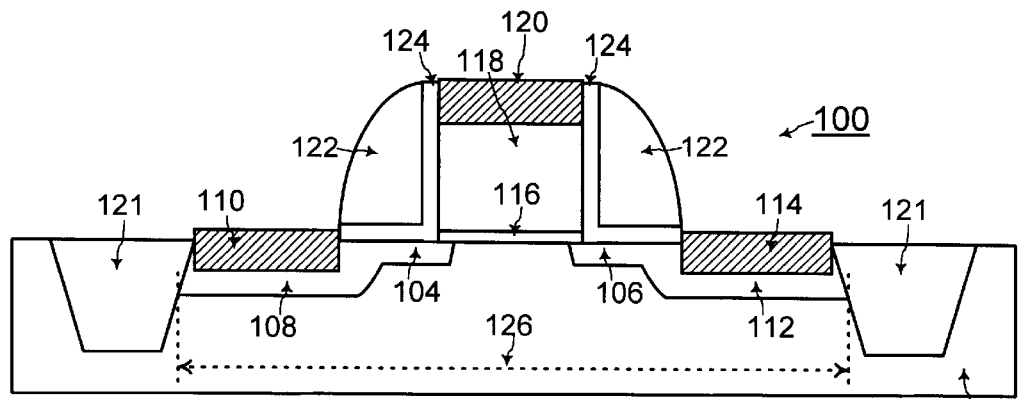
FIG. 1 shows a cross-sectional view of a conventional MOSFET (Metal Oxide Semiconductor Field Effect Transistor) of the prior art having drain and source extension junctions without any halo regions.
Figure 2:
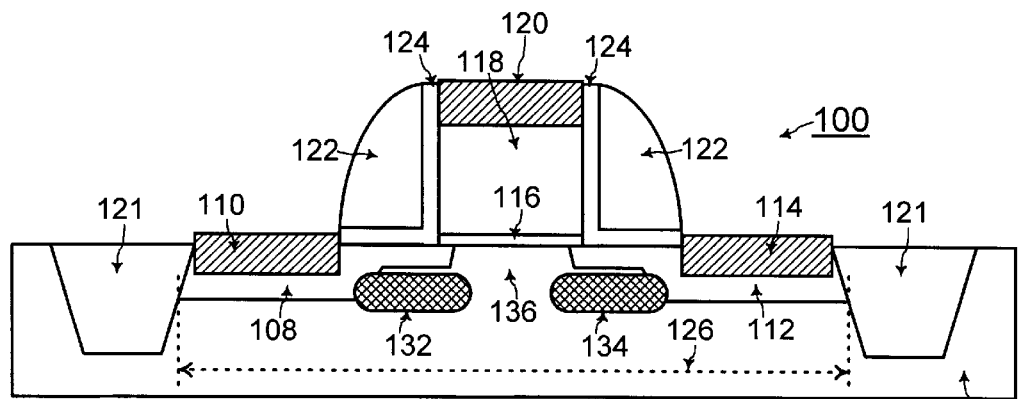
FIG. 2 shows the cross-sectional view of the conventional MOSFET of FIG. 1 having halo regions of the prior art that undesirably extend into the drain and source contact junctions and the channel region of the MOSFET.
Figure 3:
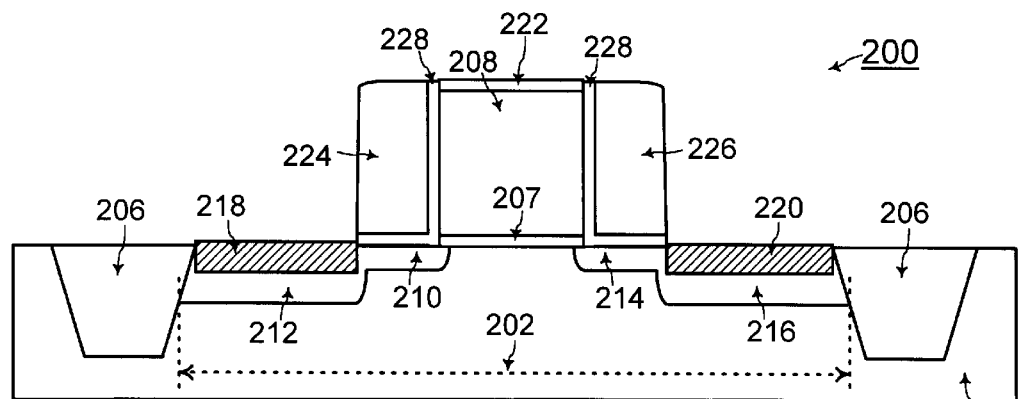
FIGS. 3, 4, 5, 6, 7, 8, 9, 10, and 11 show cross-sectional views for illustrating the steps for fabricating a MOSFET (Metal Oxide Semiconductor Field Effect Transistor) with highly confined halo regions formed by etching away dummy spacers to implant halo dopant through dummy spacer openings disposed substantially over the drain and source extension junctions, according to an embodiment of the present invention.

Referring to FIG. 3, a MOSFET (Metal Oxide Semiconductor Field Effect Transistor) 200 is fabricated within an active device area 202 of a semiconductor substrate 204 defined by shallow trench isolation structures 206. Processes for formation of shallow trench isolation structures for electrically isolating integrated circuit devices within a semiconductor substrate are known to one of ordinary skill in the art of integrated circuit fabrication.

A gate dielectric 207 and a gate structure 208 are formed. The gate dielectric 207 is comprised of silicon dioxide (SiO$_2$) or a high dielectric constant material as known to one of ordinary skill in the art of integrated circuit fabrication in one embodiment of the present invention. The gate structure 208 is comprised of polysilicon in one embodiment of the present invention. A drain extension junction 210 and a drain contact junction 212 are formed within the semiconductor substrate 204 to a first side of the gate structure 208. A source extension junction 214 and a source contact junction 216 are formed within the semiconductor substrate 204 to a second side of the gate structure 208. A drain silicide 218 is formed within the drain contact junction 212, and a source silicide 220 is formed within the source contact junction 216. Processes for formation of such elements 207, 208, 210, 212, 214, 216, 218, and 220 of the MOSFET 200 are known to one of ordinary skill in the art of integrated circuit fabrication.

In an aspect of the present invention, any thermal anneal processes for activating dopant within the gate structure 208, the drain and source extension junctions 210 and 214, and the drain and source contact junctions 212 and 216 are performed before formation of the halo regions. Furthermore, the process for forming the drain silicide 218 and the source silicide 220 which heats up the semiconductor substrate 204 is also performed before formation of the halo regions.

For forming halo regions of an embodiment of the present invention, after formation of the elements 207, 208, 210, 212, 214, 216, 218, and 220 of the MOSFET 200, a capping layer 222 is formed on top of the gate structure 208. In one embodiment of the present invention, the capping layer 222 is comprised of silicon oxynitride (SiON) having a thickness of from about 50 Å (angstroms) to about 70 Å (angstroms), and processes for forming such a capping layer 222 are known to one of ordinary skill in the art of integrated circuit fabrication. A first dummy spacer 224 is formed on the first side wall of the gate structure 208 and the gate dielectric 207, and a second dummy spacer 226 is formed on the second side wall of the gate structure 208 and the gate dielectric 207.

In one embodiment of the present invention, the first and second dummy spacers 224 and 226 are comprised of silicon nitride ($Si_3N_4$). When the gate structure 208 is comprised of polysilicon, a liner oxide layer 228 is formed between the dummy spacers 224 and 226 and the sidewalls of the gate structure 208 to provide a smooth transition between the dummy spacers 224 and 226 and the sidewalls of the gate structure 208. Processes for forming such first and second dummy spacers 224 and such liner oxide layer 228 are known to one of ordinary skill in the art of integrated circuit fabrication.

Figure 4:
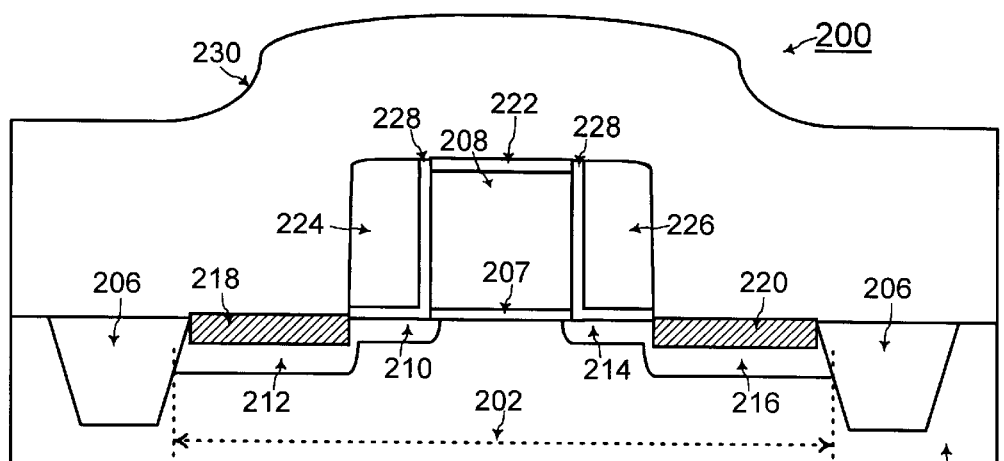

Referring to FIG. 4, a layer of insulating material 230 is blanket deposited to cover the first and second dummy spacers 224 and 226 and the gate structure 208. In one embodiment of the present invention, the layer of insulating material 230 is comprised of silicon dioxide ($SiO_2$) having a relatively high thickness of from about 3000 Å (angstroms) to about 4000 Å (angstroms). Such a layer of insulating material 230 having the relatively high thickness extends above the top surfaces of the first and second dummy spacers 224 and 226 and the gate structure 208. Chemical vapor deposition processes, such as TEOS oxide deposition processes, for depositing such a layer of insulating material 230 are known to one of ordinary skill in the art of integrated circuit fabrication. The capping layer 222 of silicon oxynitride (SiON) on top of the gate structure 208 prevents oxidation of the gate structure 208 to preserve the gate structure 208 during such a process for deposition of the layer of insulating material 230.

Figure 5:
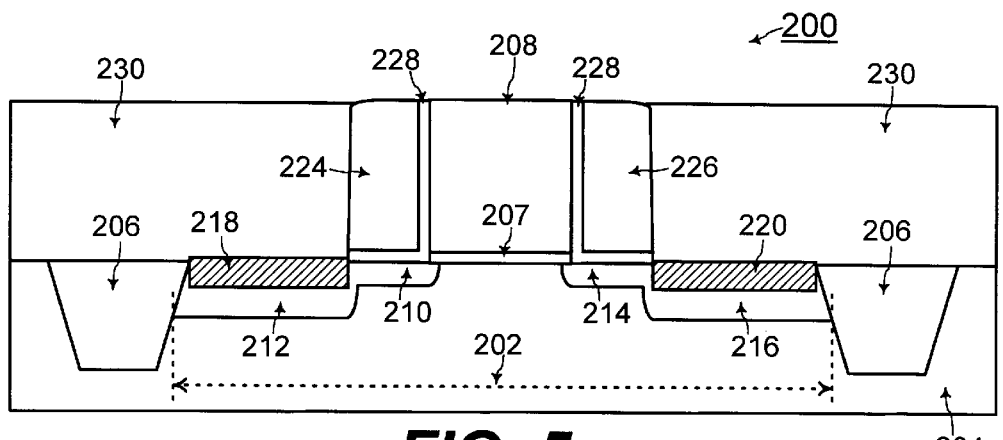

Referring to FIG. 5, the layer of insulating material 230 is polished down until the first and second dummy spacers 224 and 226 and the gate structure 208 are exposed. Thus, the top surfaces of the first and second dummy spacers 224 and 226 and the gate structure 208 are level with the top surfaces of the layer of insulating material 230. Processes, such as CMP (chemical mechanical polishing) processes, for polishing the layer of insulating material 230 are known to one of ordinary skill in the art of integrated circuit fabrication.

Figure 6:
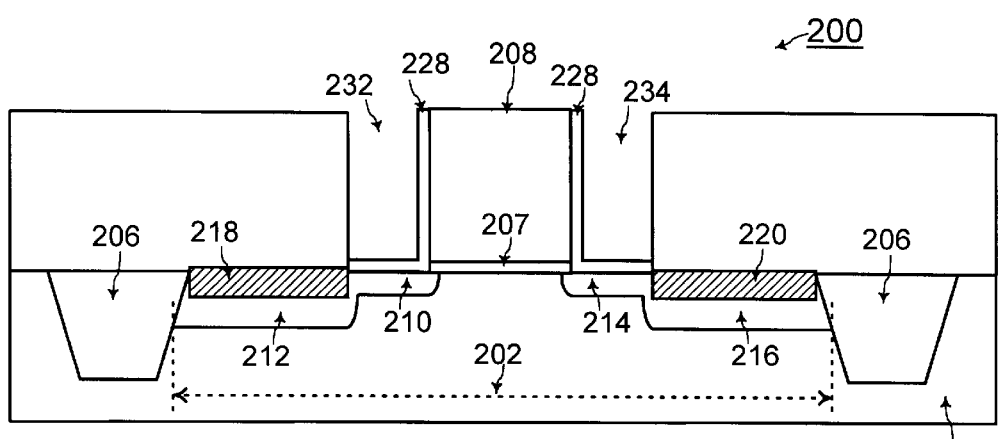

Referring to FIGS. 5 and 6, the first dummy spacer 224 is etched away to form a first spacer opening 232, and the second dummy spacer 226 is etched away to form a second spacer opening 234. When the first and second dummy spacers 224 and 226 are comprised of silicon nitride ($Si_3N_4$), an etch process for selectively etching away substantially only the silicon nitride ($Si_3N_4$) of the first and second dummy spacers 224 and 226 is used to form the first and second spacer openings 232 and 234. Such selective etch processes, using phosphoric acid for example, are known to one of ordinary skill in the art of integrated circuit fabrication.

Figure 7:
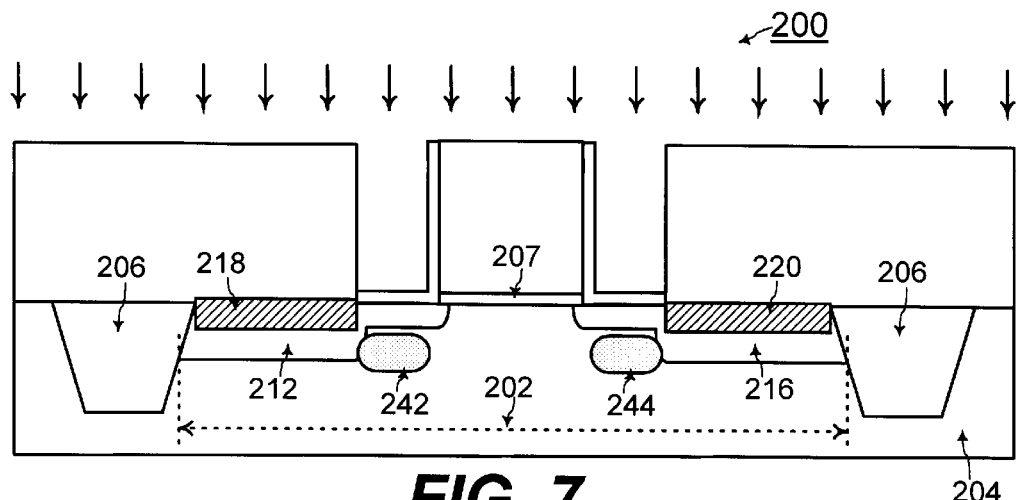

Referring to FIG. 7, an amorphization dopant is implanted toward the semiconductor substrate 204 to form amorphous semiconductor regions in a drain halo region 242 and a source halo region 244. The drain halo region 242 is formed from the amorphization dopant being implanted through the first spacer opening 232, and the source halo region 244 is formed from the amorphization dopant being implanted through the second spacer opening 234. The layer of insulating material 230 blocks the amorphization dopant from being implanted into areas of the semiconductor substrate 204 not under the first and second spacer openings 232 and 234. Thus, the drain halo region 242 is disposed substantially beneath the drain extension junction 210 within the semiconductor substrate 204, and the source halo region 244 is disposed substantially beneath the source extension junction 214 within the semiconductor substrate 204.

The amorphization dopant implanted into the drain and source halo regions 242 and 244 renders the semiconductor substrate to have an amorphous crystal structure within the drain and source halo regions 242, as known to one of ordinary skill in the art of integrated circuit fabrication. A dopant within an amorphous semiconductor region may be activated at a lower temperature, as known to one of ordinary skill in the art of integrated circuit fabrication. In one embodiment of the present invention, the semiconductor substrate 204 is comprised of silicon, and the amorphization dopant is comprised of one of germanium(Ge), silicon (Si), or antimony (Sb). Implantation processes for implanting such an amorphization dopant are known to one of ordinary skill in the art of integrated circuit fabrication.

Figure 8:
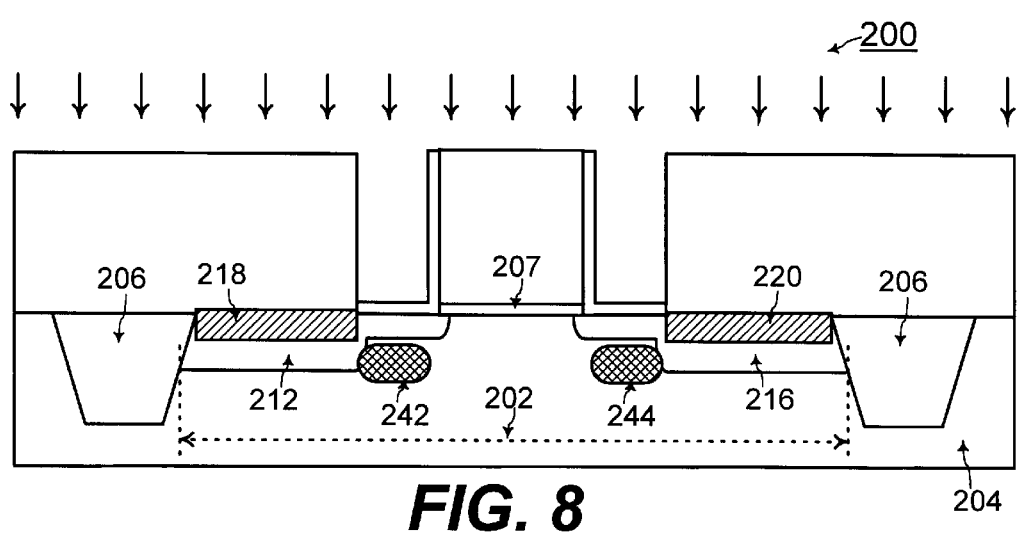

Referring to FIG. 8, a halo dopant is implanted toward the semiconductor substrate 204 through the first and second spacer openings 232 and 234 and into the drain and source halo regions 242 and 244. The layer of insulating material 230 blocks the halo dopant from being implanted into areas of the semiconductor substrate 204 not under the first and second spacer openings 232 and 234. Thus, the drain halo region 242 with the halo dopant is disposed substantially beneath the drain extension junction 210 within the semiconductor substrate 204, and the source halo region 244 with the halo dopant is disposed substantially beneath the source extension junction 214 within the semiconductor substrate 204.

The parameters of the process for implanting the halo dopant are adjusted such that the halo dopant is implanted substantially into the drain and source halo regions 242 and 244 formed by the former implantation of the amorphization dopant in FIG. 7. Such processes for implanting the halo dopant are known to one of ordinary skill in the art of integrated circuit fabrication.

When the MOSFET 200 is an NMOSFET (N-channel Metal Oxide Semiconductor Field Effect Transistor), the halo dopant is comprised of one of boron (B) or boron fluoride ($BF_2$) according to one embodiment of the present invention. On the other hand, when the MOSFET 200 is a PMOSFET (N-channel Metal Oxide Semiconductor Field Effect Transistor), the halo dopant is comprised of one of arsenic (As) or phosphorous (P) according to one embodiment of the present invention. Processes for implanting such halo dopants are known to one of ordinary skill in the art of integrated circuit fabrication.

Figure 9:
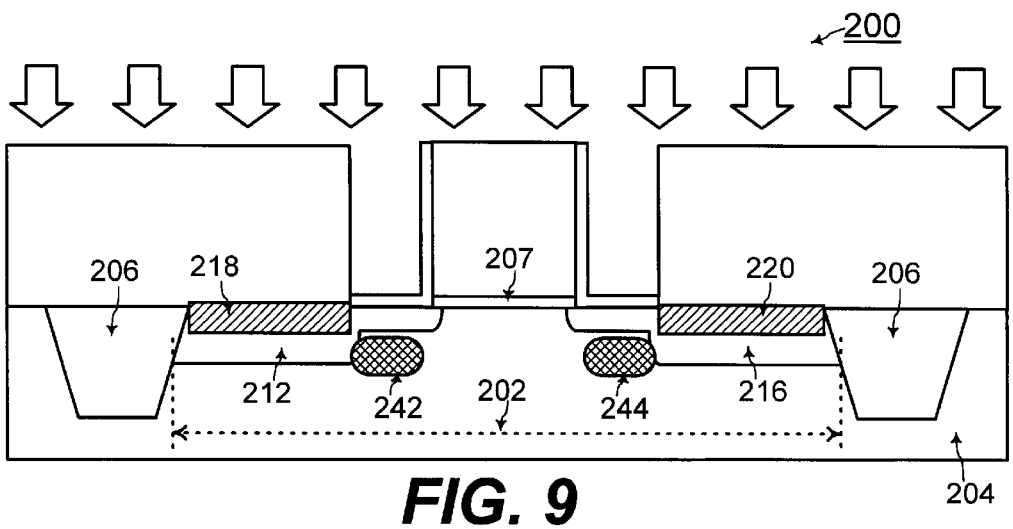

Referring to FIG. 9, a LTP (Laser Thermal Process) is performed whereby laser beams are directed towards the semiconductor wafer 204. LTP processes are known to one of ordinary skill in the art of integrated circuit fabrication. During the LTP (Laser Thermal Process), the halo dopant is activated within the drain and source halo regions 242 and 244. The gate structure 208 and the layer of insulating material 230 block the laser beams from the semiconductor substrate 204 in the areas of the semiconductor substrate 204 not under the first and second spacer openings 232 and 234. Thus, the halo dopant within substantially only the drain and source halo regions 242 and 244 is activated during the LTP (Laser Thermal Process). In this manner, the drain and source halo regions 242 and 244 having the activated halo dopant are confined to be substantially beneath the drain and source extension junctions 210 and 214.

In addition, because the drain and source halo regions 242 and 244 are amorphous semiconductor regions, the temperature for activating the halo dopant within such regions 242 and 244 is lowered to minimize transient enhanced diffusion of the halo dopant during the LTP (Laser Thermal Process). With minimized transient enhanced diffusion of the halo dopant, the drain and source halo regions 242 and 244 are confined to be substantially beneath the drain and source extension junctions 210 and 214.

Figure 10:
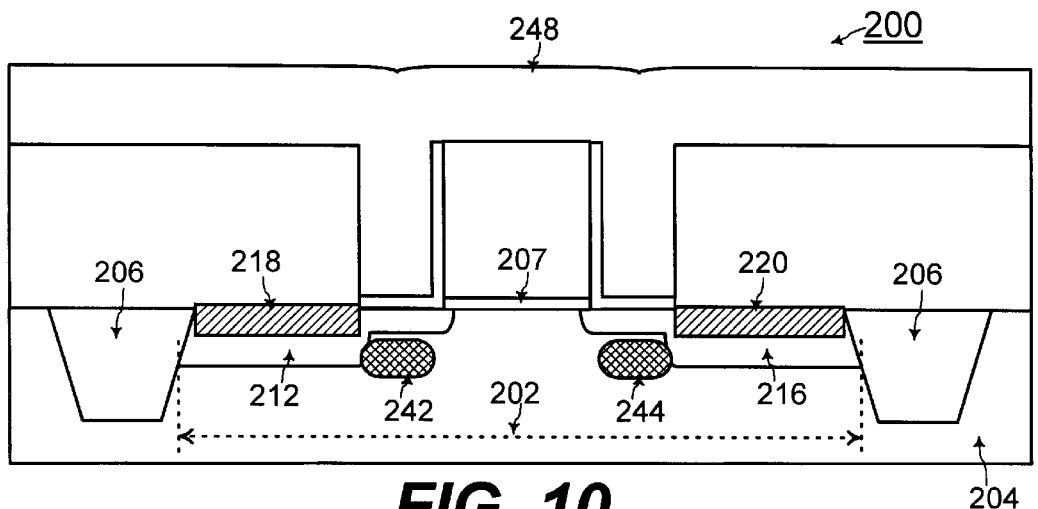

Referring to FIG. 10, after activation of the halo dopant within the drain and source halo regions 242 and 244, an insulating material 248 is deposited to fill the first and second spacer openings 232 and 234. In one embodiment of the present invention, the insulating material 248 is comprised of silicon dioxide ($SiO_2$) having a relatively high thickness of from about 3000 Å (angstroms) to about 5000 Å (angstroms). Chemical vapor deposition processes, such as TEOS oxide deposition processes, for depositing such insulating material 248 are known to one of ordinary skill in the art of integrated circuit fabrication.

Figure 11:
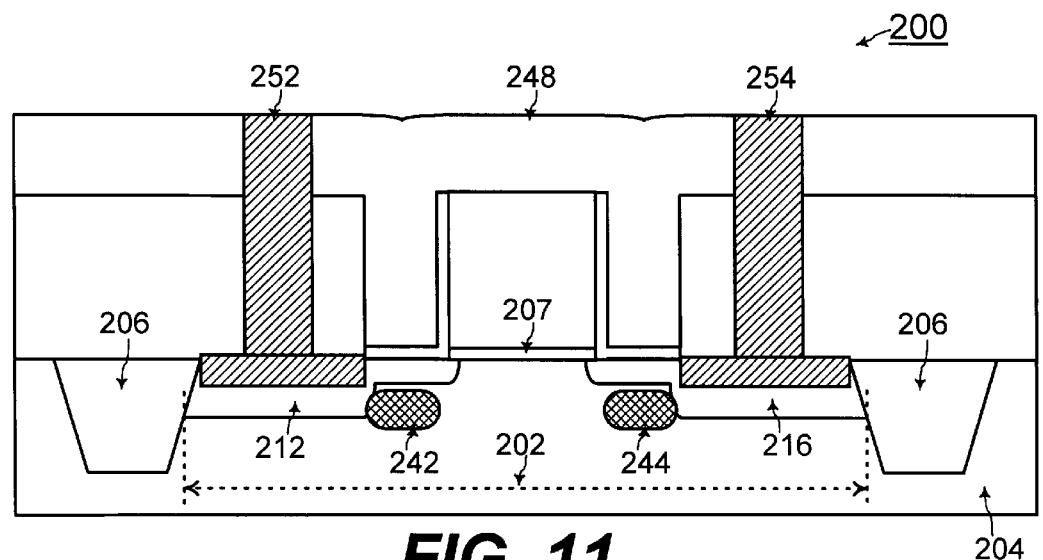

Referring to FIG. 11, a drain contact 252 and a source contact 254 are formed through the insulating materials 248 and 230. The drain contact 252 provides coupling to the drain silicide 218, and the source contact 254 provides coupling to the source silicide 220. Processes for forming such drain and source contacts 252 and 254 are known to one of ordinary skill in the art of integrated circuit fabrication.

In this manner, by implantation of the amorphization dopant and the halo dopant substantially only through the first and second spacer openings 232 and 234, the drain and source halo regions 242 and 244 are confined to be substantially only beneath the drain and source extension junctions 210 and 214 within the semiconductor substrate 204. When the drain and source halo regions 242 and 244 do not extend into the drain and source contact junctions 212 and 216, series resistance at the drain and source contact junctions 212 and 216 is minimized. When the drain and source halo regions 242 and 244 do not extend into the channel region of the MOSFET 200 between the drain and source extension junctions 210 and 214, short channel effects of the MOSFET 200 are minimized. In addition, the halo regions 242 and 244 are confined to be vertically abrupt with minimized transient enhanced diffusion of the halo dopant.

Furthermore, in one embodiment of the present invention, any thermal anneal processes for activating dopant within the gate structure 208, the drain and source extension junctions 210 and 214, and the drain and source contact junctions 212 and 216 are performed before formation of the halo regions 242 and 244. Furthermore, the process for forming the drain silicide 218 and the source silicide 220 which heats up the semiconductor substrate 204 is also performed before formation of the halo regions 242 and 244. Thus, heating and transient enhanced diffusion of the halo dopant within the drain and source halo regions 242 and 244 are minimized to further confine the drain and source halo regions 242 and 244 to be substantially only beneath the drain and source extension junctions 210 and 214 within the semiconductor substrate 204.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for forming halo regions of a field effect transistor having a gate structure on a gate dielectric within an active device area of a semiconductor substrate, the method including the steps of:

A. forming a first dummy spacer on a first sidewall of said gate structure and said gate dielectric, wherein said first dummy spacer is disposed substantially over a drain extension junction of said field effect transistor;

B. forming a second dummy spacer on a second sidewall of said gate structure and said gate dielectric, wherein said second dummy spacer is disposed substantially over a source extension junction of said field effect transistor;

C. depositing an insulating material to cover said first dummy spacer, said second dummy spacer, and said gate structure;

D. polishing down said insulating material until top surfaces of said gate structure, said first dummy spacer, and said second dummy spacer are exposed such that said top surfaces of said gate structure, said first dummy spacer, and said second dummy spacer are level with a top surface of said insulating material;

E. etching away said first dummy spacer to form a first spacer opening and etching away said second dummy spacer to form a second spacer opening;

F. implanting a halo dopant through said first spacer opening to form a drain halo region substantially beneath said drain extension junction within said semiconductor substrate and through said second spacer opening to form a source halo region substantially beneath said source extension junction within said semiconductor substrate; and G. heating up said drain halo region and said source halo region in a thermal anneal process to activate said halo dopant within said drain halo region and said source halo region;

wherein said step G includes the step of:

applying a laser beam toward said semiconductor substrate such that said laser beam applied through said first spacer opening and said second spacer opening activates said halo dopant within said drain halo region and said source halo region.

2. A method for forming halo regions of a field effect transistor having a gate structure on a gate dielectric within an active device area of a semiconductor substrate, the method including the steps of:

A. forming a first dummy spacer on a first sidewall of said gate structure and said gate dielectric, wherein said first dummy spacer is disposed substantially over a drain extension junction of said field effect transistor;

B. forming a second dummy spacer on a second sidewall of said gate structure and said gate dielectric, wherein said second dummy spacer is disposed substantially over a source extension junction of said field effect transistor;

C. depositing an insulating material to cover said first dummy spacer, said second dummy spacer, and said gate structure;

D. polishing down said insulating material until top surfaces of said gate structure, said first dummy spacer, and said second dummy spacer are exposed such that said top surfaces of said gate structure, said first dummy spacer, and said second dummy spacer are level with a top surface of said insulating material;

E. etching away said first dummy spacer to form a first spacer opening and etching away said second dummy spacer to form a second spacer opening;

F. implanting a halo dopant through said first spacer opening to form a drain halo region substantially beneath said drain extension junction within said semiconductor substrate and through said second spacer opening to form a source halo region substantially beneath said source extension junction within said semiconductor substrate;

G. heating up said drain halo region and said source halo region in a thermal anneal process to activate said halo dopant within said drain halo region and said source halo region; and H. implanting an amorphization dopant through said first spacer opening and said second spacer opening to form an amorphous semiconductor region within said drain halo region and said source halo region after said step E and before said step G.

3. The method of claim 2, wherein said amorphization dopant includes one of germanium (Ge), silicon (Si), or antimony (Sb).

4. The method of claim 2, further including the step of:
filling said first spacer opening and said second spacer opening with an insulating material after said step G.

5. The method of claim 2, wherein said first dummy spacer and said second dummy spacer are comprised of silicon nitride ($Si_3N_4$), and wherein a liner oxide layer is formed on said first and second sidewalls of said gate structure and said gate dielectric before said step A.

6. The method of claim 2, wherein said gate structure is comprised of polysilicon, wherein said insulating material deposited in said step C is comprised of silicon dioxide ($SiO_2$), and wherein said method further includes the step of:
forming a capping layer of silicon oxynitride (SiON) on top of said gate structure before said step C.

7. The method of claim 2, wherein said field effect transistor is an NMOSFET (N-channel Metal Oxide Semiconductor Field Effect Transistor), and wherein said halo dopant is comprised of one of boron (B) or boron fluoride ($BF_2$).

8. The method of claim 2, wherein said field effect transistor is a PMOSFET (P-channel Metal Oxide Semiconductor Field Effect Transistor), and wherein said halo dopant is comprised of one of arsenic (As) or phosphorous (P).

9. The method of claim 2, wherein said step G includes the step of:
applying a laser beam toward said semiconductor substrate such that said laser beam applied through said first spacer opening and said second spacer opening activates said halo dopant within said drain halo region and said source halo region.

10. The method of claim 2, further including the steps of:
forming a drain contact junction and a source contact junction of said field effect transistor;
performing any thermal anneal for activating dopant within said gate structure, said drain and source extension junctions, and said drain and source contact junctions before said step F; and
forming a drain silicide within said drain contact junction and a source silicide within said source contact junction before said step F.

11. A method for forming halo regions of a field effect transistor having a gate structure on a gate dielectric within an active device area of a semiconductor substrate, the method including the steps:

A. forming a first dummy spacer on a first sidewall of said gate structure and said gate dielectric, wherein said first dummy spacer is disposed substantially over a drain extension junction of said field effect transistor;

B. forming a second dummy spacer on a second sidewall of said gate structure and said gate dielectric, wherein said second dummy spacer is disposed substantially over a source extension junction of said field effect transistor;

C. depositing an insulating material to cover said first dummy spacer, said second dummy spacer, and said gate structure;

D. polishing down said insulating material until top surfaces of said gate structure, said first dummy spacer, and said second dummy spacer are exposed such that said top surfaces of said gate structure, said first dummy spacer, and said second dummy spacer are level with a top surface of said insulating material;

E. etching away said first dummy spacer to form a first spacer opening and etching away said second dummy spacer to form a second spacer opening;

F. implanting a halo dopant through said first spacer opening to form a drain halo region substantially beneath said drain extension junction within said semiconductor substrate and through said second spacer opening to form a source halo region substantially beneath said source extension junction within said semiconductor substrate;

G. heating up said drain halo region and said source halo region in a thermal anneal process to activate said halo dopant within said drain halo region and said source halo region;

H. forming a drain contact junction and a source contact junction of said field effect transistor;

I. performing any thermal anneal for activating dopant within said gate structure, said drain and source extension junctions, and said drain and source contact junctions before said step F; and J. forming a drain silicide within said drain contact junction and a source silicide within said source contact junction before said step F.

12. A method for forming halo regions of a MOSFET (Metal Oxide Semiconductor Field Effect Transistor) having a gate structure on a gate dielectric within an active device area of a semiconductor substrate, the method including the sequential steps of:

A. forming a drain extension junction, a drain contact junction, a source extension junction, and a source contact junction of said MOSFET;

B. performing any thermal anneal for activating dopant within said gate structure, said drain and source extension junctions, and said drain and source contact junctions;

C. forming a drain silicide within said drain contact junction and a source silicide within said source contact junction;

D. forming a liner oxide layer on first and second sidewalls of said gate structure and said gate dielectric;

E. forming a first dummy spacer on said liner oxide layer on said first sidewall of said gate structure and said gate dielectric, wherein said first dummy spacer is disposed substantially over said drain extension junction of said MOSFET;

F. forming a second dummy spacer on said liner oxide layer on said second sidewall of said gate structure and said gate dielectric, wherein said second dummy spacer is disposed substantially over said source extension junction of said MOSFET;

wherein said first dummy spacer and said second dummy spacer are comprised of silicon nitride ($Si_3N_4$);

wherein said gate structure is comprised of polysilicon;

G. forming a capping layer of silicon oxynitride (SiON) on top of said gate structure;

H. depositing an insulating material to cover said first dummy spacer, said second dummy spacer, and said gate structure, wherein said insulating material is comprised of silicon dioxide ($SiO_2$);

I. polishing down said insulating material until top surfaces of said gate structure, said first dummy spacer, and said second dummy spacer are exposed such that said top surfaces of said gate structure, said first dummy spacer, and said second dummy spacer are level with a top surface of said insulating material;

J. etching away said first dummy spacer to form a first spacer opening and etching away said second dummy spacer to form a second spacer opening;

K. implanting an amorphization dopant through said first spacer opening and said second spacer opening to form amorphous semiconductor regions within a drain halo region substantially beneath said drain extension junction within said semiconductor substrate and within a source halo region substantially beneath said source extension junction within said semiconductor substrate;

wherein said amorphization dopant includes one of germanium (Ge), silicon (Si), or antimony (Sb);

L. implanting a halo dopant through said first spacer opening and into said drain halo region and through said second spacer opening and into said source halo region;

wherein when said MOSFET is an NMOSFET (N-channel Metal Oxide Semiconductor Field Effect Transistor), said halo dopant is comprised of one of boron (B) or boron fluoride ($BF_2$);

and wherein when said MOSFET is a PMOSFET (P-channel Metal Oxide Semiconductor Field Effect Transistor), said halo dopant is comprised of one of arsenic (As) or phosphorus (P);

M. applying a laser beam toward said semiconductor substrate such that said laser beam applied through said first spacer opening and said second spacer opening activates said halo dopant within said drain halo region and said source halo region; and N. filling said first spacer opening and said second spacer opening with silicon dioxide ($SiO_2$).

* * * * *